United States Patent [19]
Hirose et al.

[11] Patent Number: 5,602,552
[45] Date of Patent: Feb. 11, 1997

[54] D/A CONVERTER CAPABLE OF DISABLING THE OUTPUT

[75] Inventors: Shinichi Hirose; Minoru Abe, both of Itami, Japan

[73] Assignees: Mitsubishi Denki Kabushiki Kaisha, Tokyo; Mitsubishi Electric Semiconductor Software Co., Ltd., Hyogo, both of Japan

[21] Appl. No.: 345,754

[22] Filed: Nov. 22, 1994

[30] Foreign Application Priority Data

Dec. 27, 1993 [JP] Japan ................................. 5-330705

[51] Int. Cl.⁶ .................................................. H03M 1/78
[52] U.S. Cl. ..................................... 341/154; 341/144
[58] Field of Search ................................. 341/136, 144, 341/153, 154

[56] References Cited

U.S. PATENT DOCUMENTS

| | | | |
|---|---|---|---|
| 4,551,709 | 11/1985 | Merchant et al. | 341/154 |
| 4,833,473 | 5/1989 | Dingwall | 341/154 |
| 5,043,731 | 8/1991 | Nishimura | 341/154 |
| 5,119,095 | 6/1992 | Asazawa | 341/154 |

FOREIGN PATENT DOCUMENTS

| | | |
|---|---|---|
| 0177909 | 4/1986 | European Pat. Off. . |
| 0414593 | 2/1991 | European Pat. Off. . |
| 63-33014 | 12/1988 | Japan . |
| WO86/05609 | 9/1986 | WIPO . |

*Primary Examiner*—Howard L. Williams
*Attorney, Agent, or Firm*—Lowe, Price, LeBlanc & Becker

[57] ABSTRACT

A digital/analog converting circuit wherein, on the digital signal input side of each of resistances $D_1, D_2 \ldots D_n$ whose one end being connected to a digital signal input and the other end to an analog signal output, each of the three-state non-inverting buffers $B_1, B_2 \ldots B_n$ is provided, and between the analog signal output side of the resistance $D_n$ and the ground potential portion, a MOS transistor 20 is provided. It enables to switch the output/non-output or an analog signal obtained by converting a digital signal, and as a result, a digital/analog converting circuit not generating non-linear region in the digital/analog conversion characteristic can be obtained.

4 Claims, 9 Drawing Sheets

D/A CONVERTER CAPABLE OF DISABLING THE OUTPUT

BACKGROUND OF THE INVENTION

1. Field of the Invention

This invention relates to a digital/analog converting circuit, particularly to so-called R-2R type digital/analog converting circuit, more specifically, to a digital/analog converting circuit capable of switching an output/non-output of an analog signal obtained by converting a digital signal as well as capable of solving a non-linear range of a digital/analog converting characteristic generated when a non-output function of an analog signal is provided.

2. Description of Related Art

FIG. 1 is a block diagram showing a configuration of a one-chip microcomputer in which a conventional R-2R type digital/analog converting circuit 8 is built, in, and which is capable of switching the output/non-output of an analog signal to the outside.

In the one-chip microcomputer 1, a signal input/output terminal 2 which is capable of inputting and outputting of a signal to the outside is provided. In the one-chip microcomputer 1, a CPU 3, ROM 4, RAM 5, data register 6, D/A (digital/analog) converter select register 7, digital/analog converting circuit 8, switching circuit 9, digital signal input/output port 10 and bus 11 are built in.

The CPU 3, ROM 4, RAM 5, data register 6, D/A converter select register 7 and digital signal input/output port 10 are connected to each other by the bus 11. Data held in the D/A converter select register 7 is given to the switching circuit 9 and the digital signal input/output port 10. Digital data held in the data register 6 is inputted to the digital/analog converting circuit 8, and the analog signal after the digital/analog conversion is outputted to the outside from the signal input/output terminal 2 through the switching circuit 9. The digital signal inputted from the outside to the signal input/output terminal 2 is to be inputted to the digital signal input/output, port 10.

In the one-chip microcomputer 1, when the switching circuit 9 is turned to ON by the data held in the D/A converter select register 7, an analog signal converted from a digital signal by the digital/analog converting circuit 8 is outputted to the signal input/output terminal 2. On the other hand, in the case where the switching circuit is turned to OFF, when a digital signal is input ted to the signal input/output terminal 2 from the outside, the digital signal is input ted to the digital signal input/output port 10. The one-chip microcomputer 1 can also output, a digital signal From the digital signal input output port 10 to the signal input/output terminal 2.

FIG. 2 is a circuit diagram showing a configuration of the digital/analog converting circuit 8 and the switching circuit 9.

Reference character DT designates a digital signal, which is composed of a plurality of bits (n bits) of the MSB to the LSB.

Each of reference characters $B_1, B_2 \ldots B_n$ designates a non-inverting buffer having an output resistance value of r. To one end of each of these non-inverting buffers $B_1, B_2 \ldots B_n$, the signal of each bit of the aforementioned digital signal is inputted.

Each of characters $D_1, D_2 \ldots D_n$ designates a resistance having a resistance value 2R–r. To the one end of each of these resistances $D_1, D_2 \ldots D_n$, the output side (the other end) of the aforementioned each of the non-inverting buffers $B_1, B_2 \ldots B_n$ is connected.

The other end of the resistance $D_1$ is grounded through a serial circuit of resistances $E_1, E_2 \ldots$ each having a resistance value R and resistance $E_n$ having a resistance value 2R. The other end of the resistance $D_2$ is connected to a connecting node between the resistances $E_1$ and $E_2$, and the other end of the resistance $D_n$ is connected to the one end of the non-grounded side of the resistance $E_n$.

The other end of the resistance D1 is also connected to one end of a parallel circuit of a P channel MOS transistor $Q_P$ and an N channel MOS transistor $Q_N$. This parallel circuit configures the switching circuit 9 shown in FIG. 1. From the other end of the parallel circuit, of the MOS transistor $Q_P$ and the MOS transistor $Q_N$, an analog signal AN is outputted. An ON/OFF control signal $S_C$ which ON/OFF controls the MOS transistors $Q_P$ and $Q_N$ is inputted to a gate of the MOS transistor $Q_N$ as well as to a gate of the MOS transistor $Q_P$ through an inverter IV.

FIG. 8 is a circuit diagram showing a common configuration of each of the non-inverting buffers $B_1, B_2 \ldots B_n$.

The output side of the inverter $IV_B$, to which each bit of the digital signal DT is inputted, is connected to a gate of the P-channel MOS transistor $Q_{PB}$ and to a gate of the N-channel MOS transistor $Q_{NB}$ which are connected seriously. To one end of the serial circuit of the P channel MOS transistor $Q_{PB}$ and the N channel MOS transistor $Q_{NB}$, a power potential $V_D$ is given, and to the other end, a ground potential $V_S$ is given. From the connecting node of the MOS transistors $Q_{PB}$ and $Q_{NB}$, a digital signal is outputted.

In the following, explanation will be given on the operation of the conventional digital/analog converting circuit 8 and the switching circuit 9.

When a signal of each bit of the digital signal DT is inputted to each of the non-inverting buffers $B_1, B_2 \ldots B_n$, the output of the inverter $IV_B$ to which a signal of "H" level (or "L" level) is inputted becomes "L" level (or "H" level), and the MOS transistor $Q_{PB}$ (or $Q_N B$) is turned to ON so that a signal of the power potential $V_D$ (or ground potential $V_S$), that is, "H" level (or "L" level) is outputted. And the signal outputted from each of the non-inverting buffers $B_1, B_2 \ldots B_n$ corresponding to a signal of each bit of the digital signal DT is given to the resistance group comprising the resistances $D_1, D_2 \ldots D_n$ and the resistances $E_1, E_2 \ldots E_n$, so that a digital signal is converted into an analog signal. From the digital/analog converting circuit 8 of n bits, an analog signal of $2^n$ steps of voltage level of 0, $V_D/2^n \ldots \{(2^n-1)V_D\}/2^n$ is obtained.

And when the ON/OFF control signal $S_C$ becomes in "H" level, the digital/analog converting circuit 8 performs digital/analog conversion. On the contrary, when the ON/OFF control signal $S_C$ becomes in "L" level and all of the inputs of the non-inverting buffers $B_1, B_2 \ldots B_n$ are in "L" level, the digital/analog conversion is not performed. When the ON/OFF control signal $S_C$ is in "H" level, an analog signal AN obtained by converting a digital signal is outputted from the switching circuit 9 and when the ON/OFF control signal $S_C$ is in "L" level, the analog signal AN is not to be outputted from the switching circuit 9.

By the way, in the case where the analog signal AN, which is obtained by converting a digital signal into an analog signal and outputted from the switching circuit 9, is given to a load resistance L as shown in FIG. 2, when the resistance value of the load resistance L is extremely high, electric current seldom flows through the load resistance L. Therefore, since electric current seldom flows through the switching circuit 9, electric current of the analog signal seldom flows through the load resistance L. Therefore, as shown in FIG. 4 by a broken line X, the voltage level of the analog signal after converting the digital signal changes linearly.

But when the resistance value of the load resistance L is low, the electric potential is dropped by the on-resistance of the MOS transistors $Q_P$ and $Q_N$ of the switching circuit 9. In a predetermined range of the input potential of the on-resistance, there is an area where the on-resistance becomes extremely high. Therefore, when the electric current of the load resistance L is large, as shown by the solid line Y in FIG. 4, in a predetermined range H of a digital signal, the voltage level of an analog signal does not change linearly with respect to the digital signal. So, there is a problem that conversion accuracy of a digital signal to an analog signal is reduced when the resistance value of the load resistance is small.

In order to improve the precision of digital to analog conversion for such a change of a digital signal, the voltage level of an analog signal had better change linearly. Therefore, it is necessary to widen the channel width W of the transistors $Q_P$ and $Q_N$ of the switching circuit 9 so as to reduce the on resistance. But in such a case, various problems generated at the time of integrating the digital/analog converting circuit in a microcomputer, especially in a one-chip microcomputer.

SUMMARY OF THE INVENTION

The present invention has been devised in consideration of such problems as aforementioned which the so-called R-2R type digital/analog converting circuit has, and the object of the invention is to provide a digital/analog converting circuit capable of switching the output/non-output of an analog signal obtained by converting a digital signal and reducing the nonlinearly error by making the voltage level of an analog signal change linearly for the change of a digital signal.

The digital/analog converting circuit related to the invention is the so-called R-2R type digital/analog converting circuit, and is provided with each first switching element capable of being in the non-output state and positioned at the input side of a each resistance to which a signal of each bit of a digital signal is inputted, and with a second switching element capable of being in the non-output state and positioned between a group of resistances connecting the output sides of the aforementioned resistances in a state of a ladder and a positive or negative reference potential, and is so configured that the first switching elements and the second switching element are switched to an output state or non-output state respectively by a control signal.

In the digital/analog converting circuit related to the invention, when each of the first switching elements and the second switching element are in the output state, each of the first switching elements selects positive or negative reference potential corresponding to an inputted signal of each bit to output it to each resistance, and the second switching element connects the resistance to the reference potential. Therefore, an analog signal is outputted according to the positive or negative reference potential selected by each first switching element. On the other hand, when each of the first switching elements and the second switching element are in the non-output state, each first switching element does not output positive or negative reference potential to each resistance, and the second switching element cuts out the resistance from the reference potential. Thereby, a digital signal is not converted to an analog signal. Accordingly, the output/non-output of an analog signal can be switched, and electric current does not flow through a resistance in the non-output state.

The above and further objects and features of the invention will more fully be apparent from the following detailed description with accompanying drawings.

BRIEF DESCRIPTION OF THE DRAWINGS

FIG. 1 is a block diagram showing an example of an internal configuration of a one-chip microcomputer in which a conventional R-2R type digital/analog converting circuit is built in;

DESCRIPTION OF THE PREFERRED EMBODIMENTS

In the following, explanation will be made on the present invention referring to drawings showing the embodiments thereof.

Figure 5:
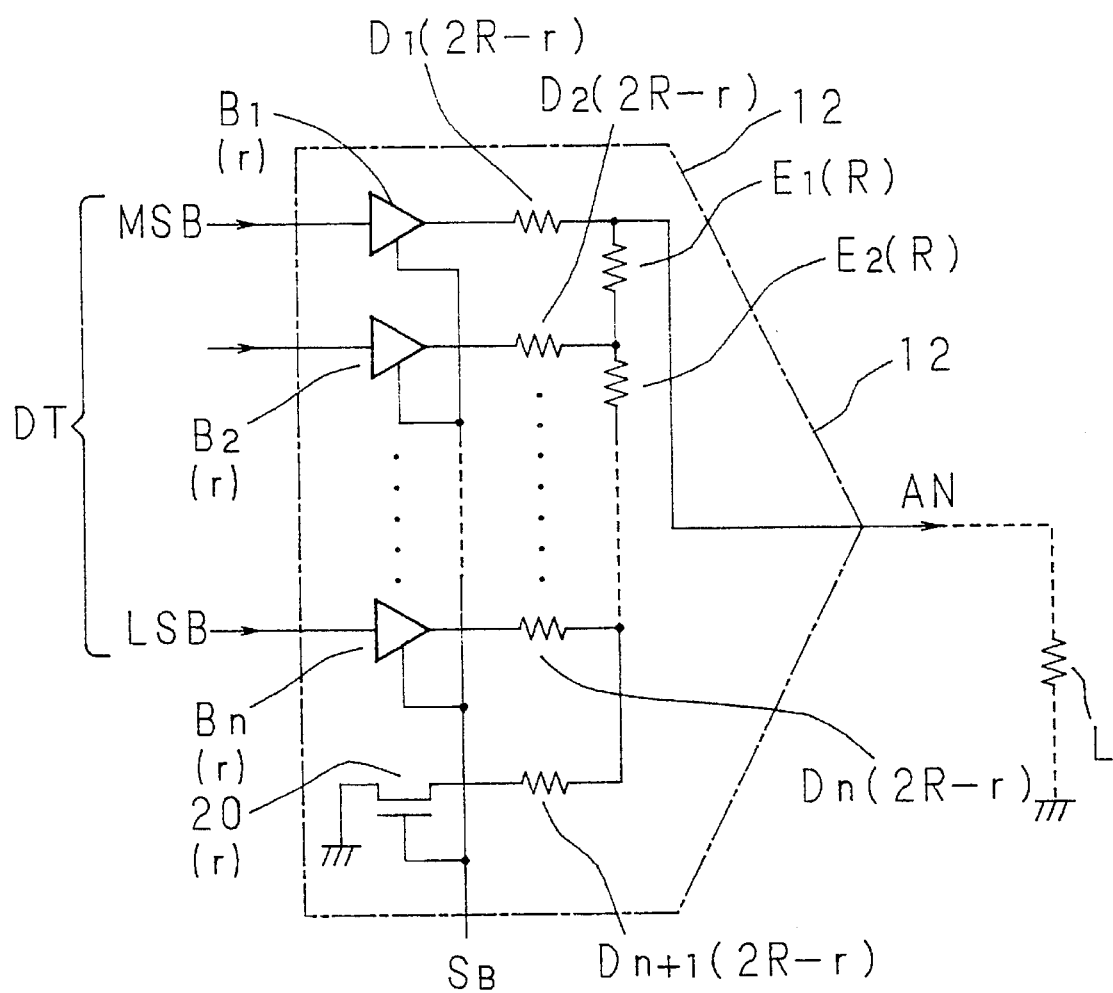
FIG. 5 is a circuit diagram showing an example of a configuration of an R-2R type digital/analog converting circuit related to the invention.

FIG. 5 is a circuit diagram showing an example of a configuration of the digital/analog converting circuit, related to the invention. In FIG. 5, a character in each () shows a resistance value.

Reference character DT designates a digital signal, which is composed of a plural bits (n bits) of the MSB to the LSB.

Reference characters $B_1, B_2 \ldots B_n$ respectively show non-inverting buffers each being a three-state buffer whose output resistance value is r. To each one end of these non-inverting buffers $B_1, B_2 \ldots B_n$, a signal of each bit, of the aforementioned digital signal DT is inputted.

Each of the reference characters $D_1, D_2 \ldots D_n$ designates a resistance of resistance value of 2R–r. To one end of each of the resistances $D_1, D_2 \ldots D_n$, the output side (the other end) of each of the aforementioned non-inverting buffers $B_1, B_2 \ldots B_n$ is connected.

The other end of the resistance $D_1$ is grounded through a serial circuit composed of resistances $E_1, E_2 \ldots$ each having a resistance value of R, resistance $D_{n+1}$ having a resistance value of 2R–r and a MOS transistor 20. The other end of the resistance D2 is connected to a connecting node between the resistances $E_1$ and $E_2$. The other end of the resistance $D_n$ is connected to the one end of the side to which the MOS transistor 20 of the resistance $D_{n+1}$ is not connected.

From the other end of the resistance $D_1$, an analog signal AN is outputted. To control terminals of the non-inverting buffers $B_1, B_2 \ldots B_n$ and a gate of the MOS transistor 20, an ON/OFF control signal $S_B$ is given. Resistances values of the resistances $D_1, D_2 \ldots D_{n+1}$ is selected in consideration of the on-resistance of the non-inverting buffers $B_1, B_2 \ldots B_n$, and the MOS transistor 20. That is, on-resistance of each of the non-inverting buffers $B_1, B_2 \ldots B_n$ and on-resistance of the MOS transistor 20 are made equal.

A digital/analog conversion circuit 12 is composed of the non-inverting buffers $B_1, B_2 \ldots B_n$, the resistances $D_1, D_2 \ldots D_n$, the resistances $E_1, E_2 \ldots$ and the MOS transistor 20.

Figure 6:
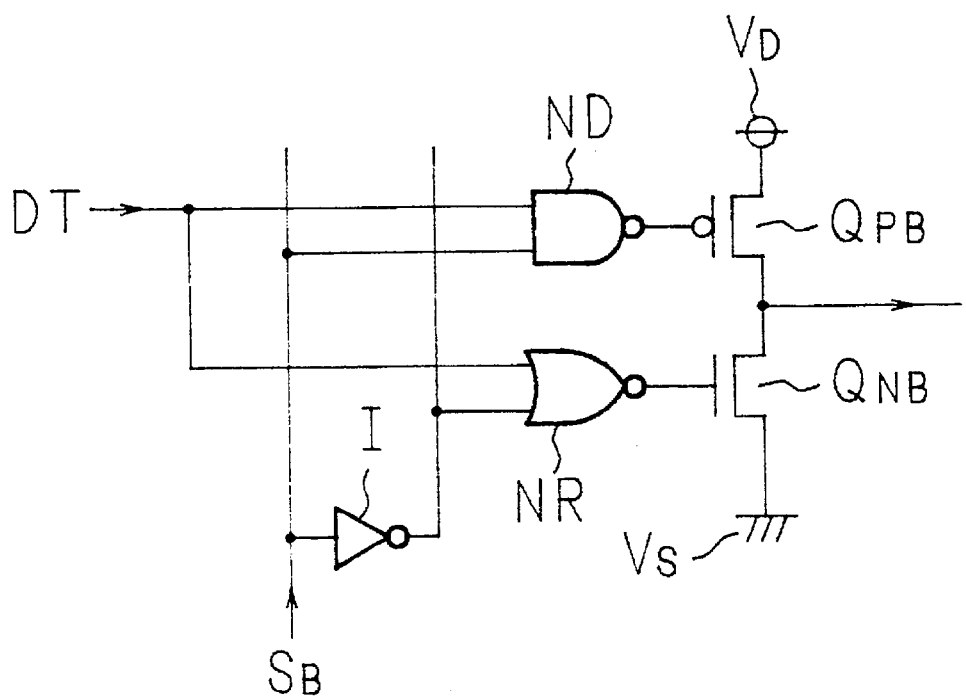
FIG. 6 is a circuit diagram showing a configuration of a non-inverting buffer shown in FIG. 5.

FIG. 6 is a circuit diagram showing a common configuration of each of the non-inverting buffers $B_1, B_2 \ldots B_n$.

A signal of each bit of the digital signal DT is inputted to one input terminal of a NAND circuit ND of CMOS configuration and to one input terminal of a NOR circuit NR of CMOS configuration. The ON/OFF control signal $S_B$ is inputted to the other input terminal of the NAND circuit ND and an inverter I. The output of the inverter I is inputted to the other input terminal of the NOR circuit NR. The output of the NAND circuit ND is inputted to a gate of a P channel transistor $Q_{PB}$, and the output of the NOR circuit NR to a gate of an N channel transistor $Q_{NB}$. To one end of a series circuit, of the P channel transistor $Q_{PB}$ and N channel transistor $Q_{NB}$, a potential $V_D$ which is a positive reference potential is given, and to the other end, a potential $V_S$ which is a negative reference potential is given. The potential $V_D$ or $V_S$ is outputted from the connecting node of the transistor $Q_{PB}$ and the transistor $Q_{NB}$.

Next, explanation will be given on the operation of such a digital/analog converting circuit of the invention as aforementioned.

When a signal of each bit of the digital signal DT is inputted to one end of each of the non-inverting buffers $B_1, B_2 \ldots B_n$ and the ON/OFF control signal S B becomes in "H" level, the state of the non-inverting buffers $B_1, B_2 \ldots B_n$ become in the output state (enable) and the MOS transistor 20 becomes in the output state (enable) so that the resistance $D_{n+1}$ is connected to the potential $V_S$. The potential $V_D$ or $V_S$ outputted from each of the non-inverting buffers $B_1, B_2 \ldots B_n$ is given to a resistance group composed of the resistances $D_1, D_2 \ldots D_n, D_{n+1}$ and the resistances $E_1, E_2 \ldots$, so that the digital signal DT is converted into the analog signal AN. In the digital/analog conversion circuit of n bits, an analog signal of $2^n$ steps of voltage level of 0, $V_D/2^n \ldots \{(2^n-1)V_D\}/2^n$ is obtained.

Figure 7:
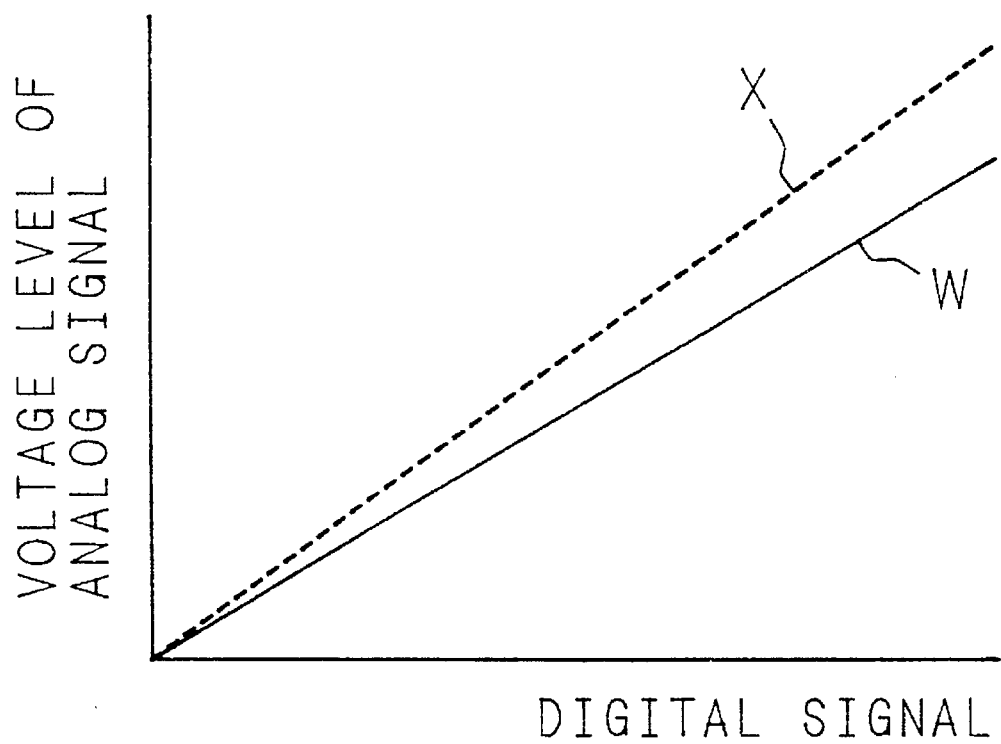
FIG. 7 is a graph showing a digital/analog conversion characteristic of the R-2R type digital/analog converting circuit related to the invention.

Here, electrical characteristic is considered when the digital/analog converting circuit is in the operation of digital/analog conversion. When an analog signal obtained by converting a digital signal by the digital/analog conversion circuit 12 is given to a load resistance L shown in FIG. 5, electric potential does not drop in the digital/analog converting circuit, 12 when the resistance value of the load resistance L is infinite (no load), and the analog potential after digital/analog conversion is given intact to the load resistance L. And the digital/analog conversion characteristic is a linear characteristic as shown by a broken line X in FIG. 7.

On the other hand, when the resistance value of the load resistance L is low, the output potential of the digital/analog converting circuit 12 becomes output potential $R_L/(R+R_L)$ at the time of no load since the output resistance of the digital/analog converting circuit 12 is R. Here, $R_L$ is a resistance value of the load resistance L. Thereby, the digital/analog conversion characteristic is the one shown by a solid line W in FIG. 7, which is lowered a little in full-scale as compared with the case of the broken line X showing the digital/analog conversion characteristic when the resistance value of the load resistance L is infinite and causes a full-scale error.

Figure 1:
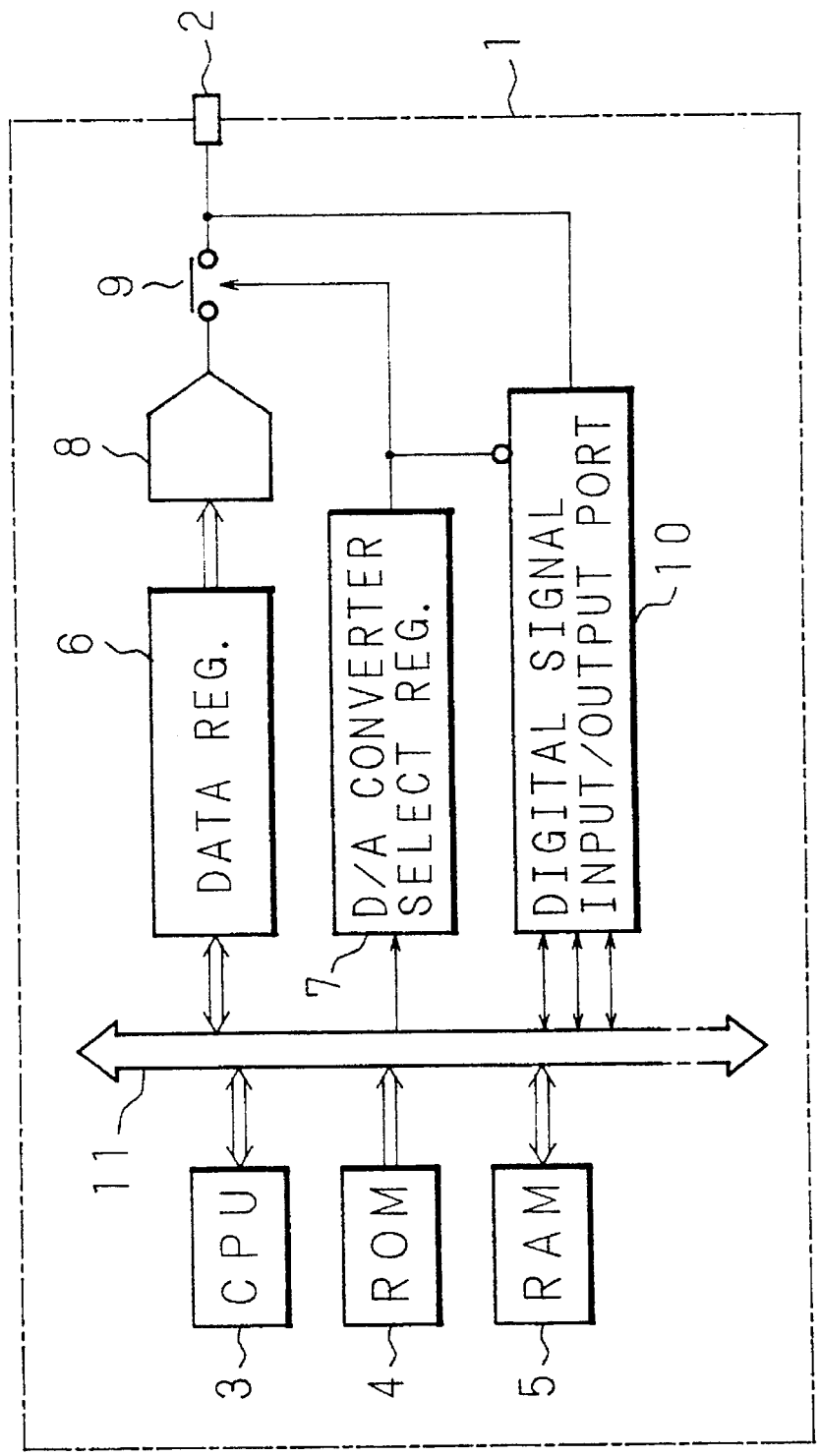
Figure 2:
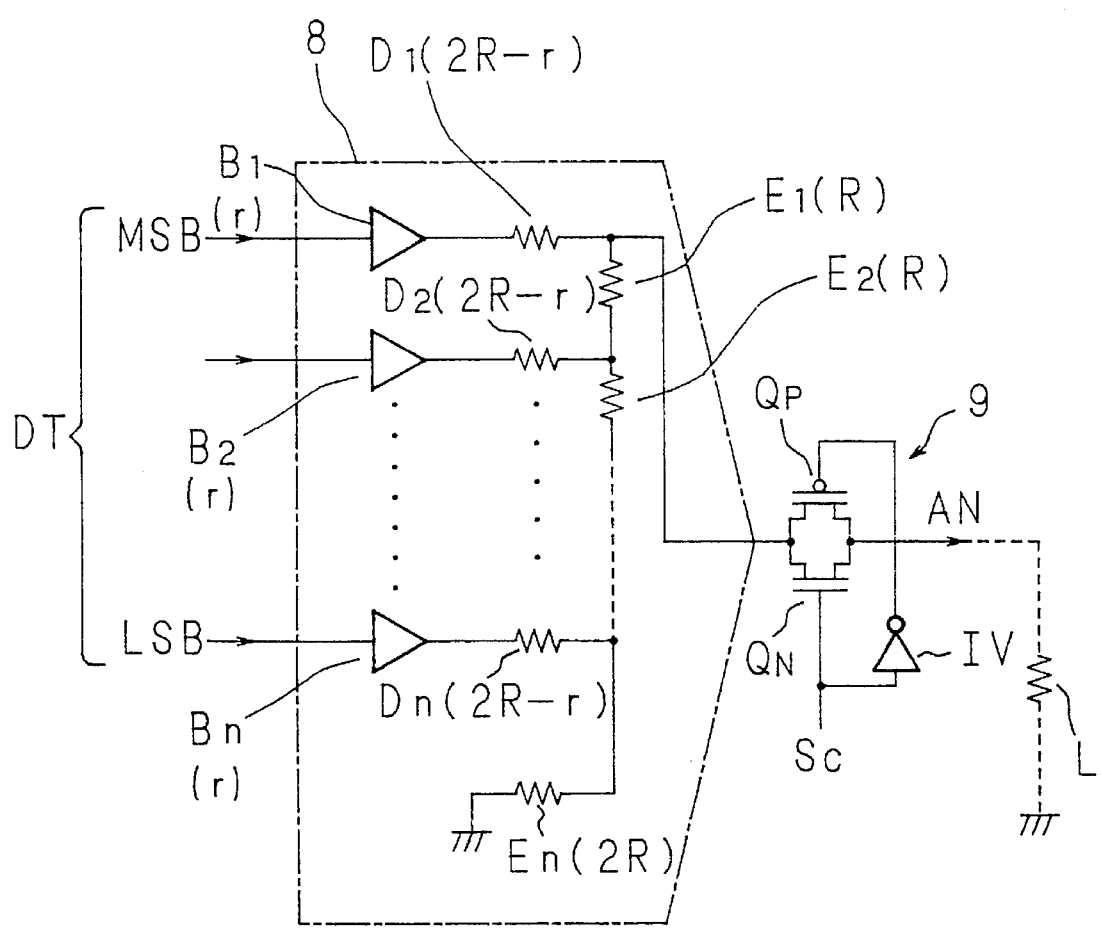
FIG. 2 is a circuit diagram showing an example of a configuration of a conventional R-2R type digital/analog converting circuit and the switching circuit.
Figure 3:
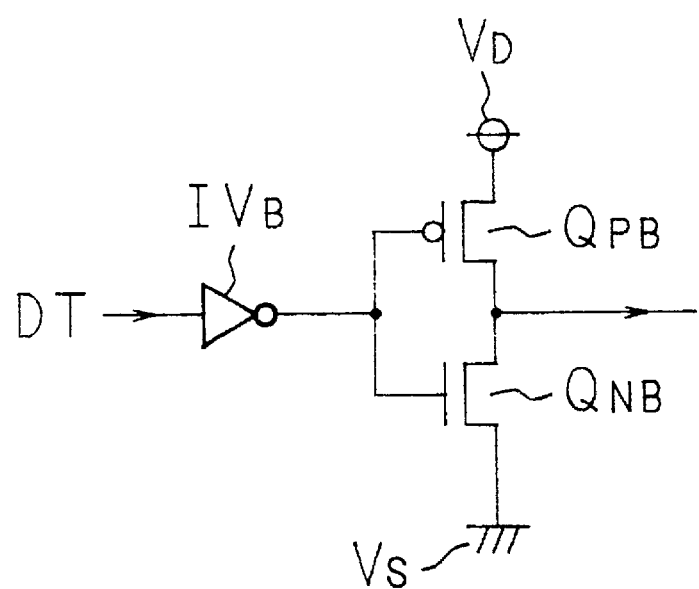
FIG. 3 is a circuit diagram showing an example of a configuration of a non-inverting buffer shown in FIG. 2.
Figure 4:
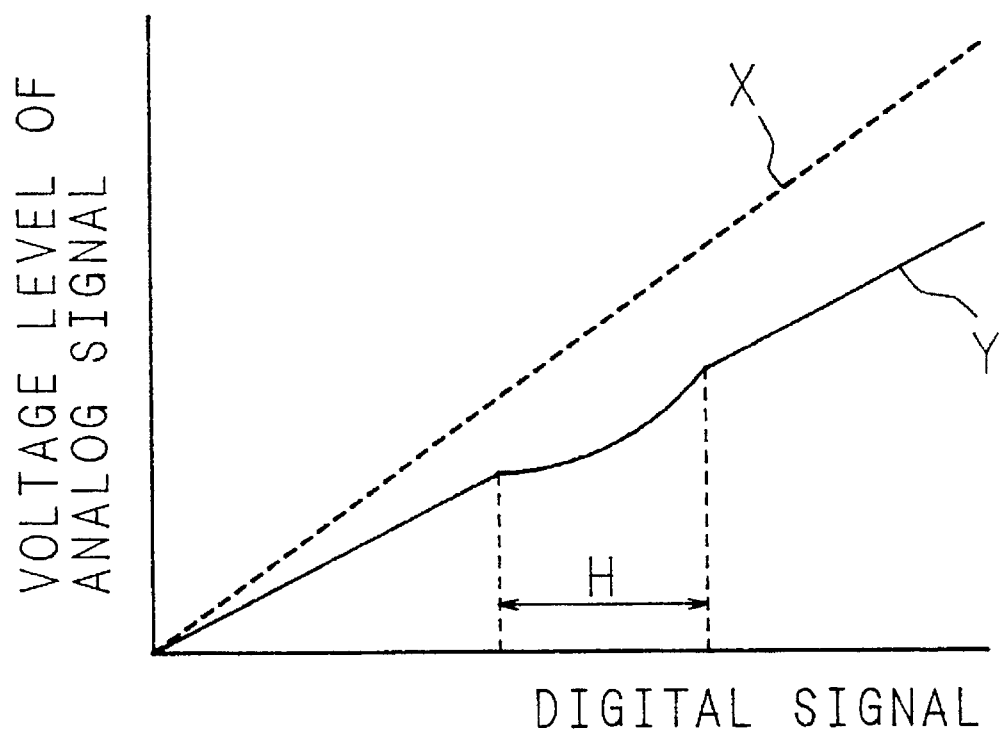
FIG. 4 is a graph showing a digital/analog converting characteristic in case of using a conventional R-2R type digital/analog converting circuit and a switching circuit.

But, in the circuit of the invention shown in FIG. 5, since there is no switching circuit (the one designated by reference numeral 9 in FIG. 1 and FIG. 2) conventionally provided for switching the output/non-output of the analog signal obtained by converting the digital signal, an effect of potential drop of an on-resistance caused by the above-mentioned fact is not caused, therefore a non-linear error by the on-resistance does not generate. Accordingly, all over the region in which a digital signal changes, an accuracy of the digital/analog conversion is improved.

On the other hand, when the ON/OFF control signal $S_B$ becomes in "L" level, the non-inverting buffers $B_1, B_2 \ldots B_n$ and the MOS transistor 20 become in no output state, the digital signal from each of the non-inverting buffers $B_1, B_2 \ldots B_n$ becomes in the non-output state, and the resistance $D_{n+1}$ is cut off from the ground potential side. Thereby, the analog signal becomes not-output state as well as the current flowing the resistance $D_{n+1}$ is cut off. Therefore, when an analog signal is not outputted, current is not consumed uselessly.

Figure 8:
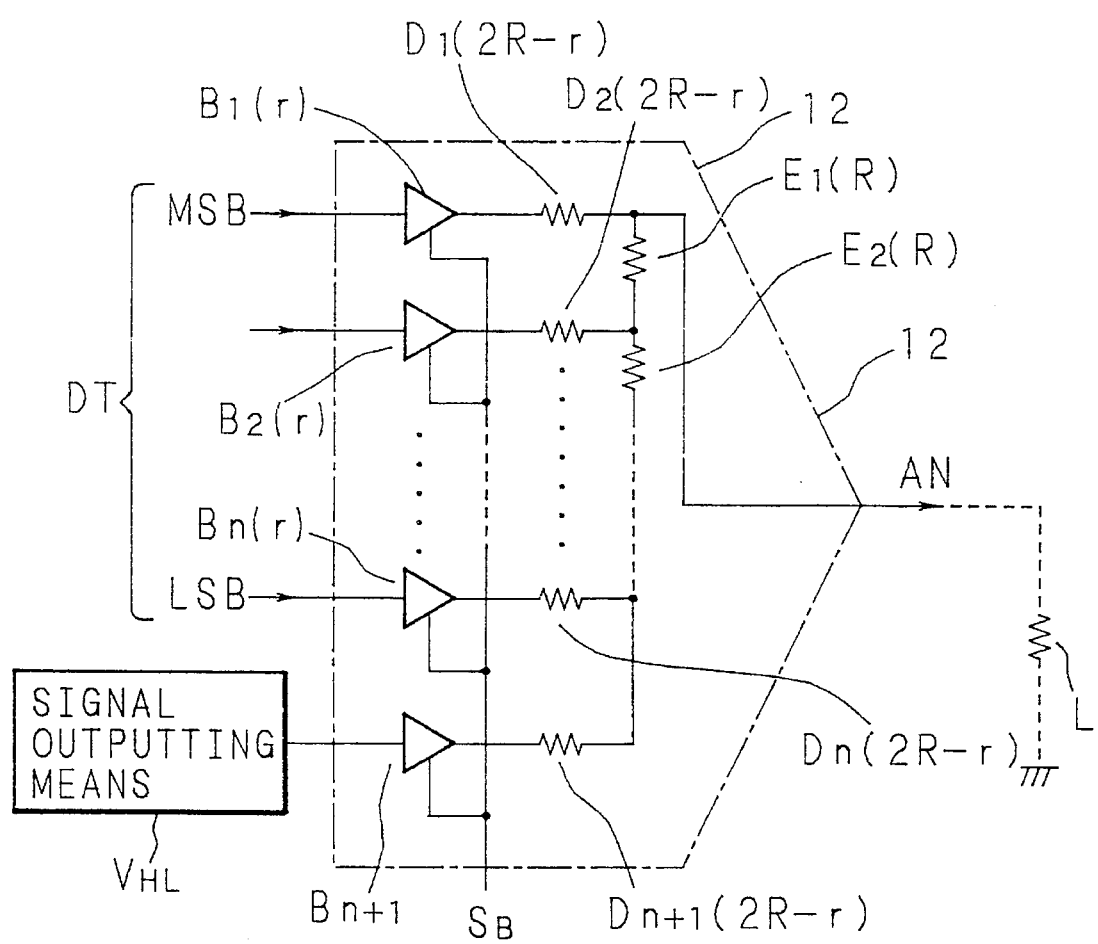
FIG. 8 is a block diagram showing an example of a configuration of another embodiment of the R-2R type digital/analog converting circuit related to the invention.

FIG. 8 is a circuit diagram showing a configuration of another embodiment of the digital/analog conversion circuit related to the invention.

In this embodiment, signal outputting means $V_{HL}$ for outputting a signal of "H" level or "L" level is provided, and the output thereof is inputted to one end of a non-inverting buffer $B_{n+2}$, provided in place of the MOS transistor 20. The other end of the non-inverting buffer $B_{n+2}$ is connected to one end of the resistance $D_{n+1}$. The non-inverting buffer $B_{n+1}$ has a configuration as shown in FIG. 6 similarly to the other non-inverting buffers $B_1, B_2 \ldots B_n$, and to the control terminal thereof, the ON/OFF control signal $S_B$ is inputted. The configuration other than that, shown in FIG. 8 is same as the configuration shown in FIG. 5, and the same parts are designated by the same reference characters and the explanation therefor will be omitted.

Next, explanation will be given oil the operation of the other embodiment of the digital/analog converting circuit of the invention shown in FIG. 8.

When a signal of "L" level, for example, is outputted from the signal outputting means $V_{HL}$, the ON/OFF control signal $S_B$ is made become in "H" level, and the non-inverting buffers $B_1, B_2 \ldots B_n$ and $B_{n+1}$ are made be in the output state, the analog signal AN of the $2^n$ steps of voltage level of 0, $V_D/2^n \ldots \{(2^n-1)V_D\}/2$ is outputted corresponding to input values of the digital signal DT from the MSB to the LSB.

When the signal outputting means $V_{HL}$ outputs a signal of "H" level and all of the signals of each bit of the digital signal DT become in "H" level, the analog signal AN of voltage level $V_D$ is outputted. Concerning all of potentials of these $2^n+1$ steps, a constant resistance characteristic of the output resistance R of the digital/analog converting circuit is obtained as a resistance value in every case.

On the other hand, when the ON/OFF control signal $S_B$ becomes in "L" level, the non-inverting buffers $B_1, B_2 \ldots B_n, B_{n+1}$ are in the non-output state, a signal corresponding to a digital signal from each of the non-inverting buffers $B_1$, $B_2 \ldots B_n$ is not outputted, and a signal of "H" level or "L" level is not outputted from the non-inverting buffer $B_{n+1}$. That is, an analog signal becomes in the non output state without being digital/analog converted as well as current does not flow through the resistance $D_{n+1}$ uselessly.

Figure 9:
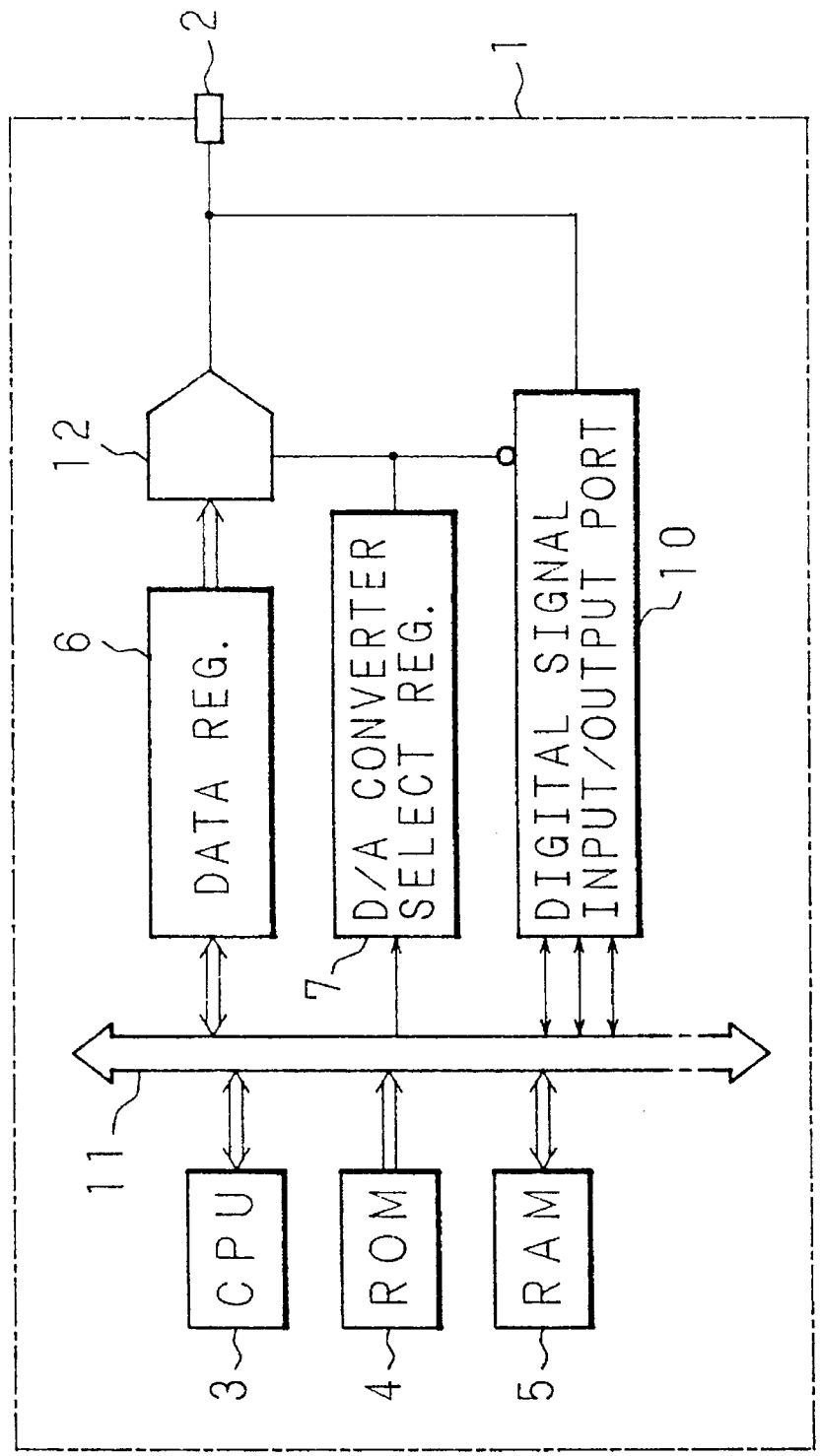
FIG. 9 is a block diagram showing an example of an internal configuration of a one-chip microcomputer building in the R-2R type digital/analog converting circuit of the invention.

FIG. 9 is a block diagram showing a configuration of a one-chip microcomputer of CMOS configuration in which the digital/analog converting circuit of the invention is built in.

In the one-chip microcomputer 1, the CPU 3, ROM 4, RAM 5, data register 6, D/A converter select register 7, digital/analog converting circuit 12, digital signal input/output port 10 and bus 11 are built in. The CPU 3, ROM 4, RAM 5, data register 6, D/A converter select register 7 and digital signal input/output port 10 are connected to each other by a bus 11. The data held by the D/A converter select register is given to the digital/analog converting circuit 12 and the digital signal input/output port 10.

The digital data held by the data register 6 is inputted to the digital/analog converting circuit 12, and the analog signal after digital/analog conversion is outputted to the outside from the signal input/output terminal 2. The digital signal inputted from the outside to the signal input/output terminal 2 is inputted to the digital signal input/output port 10.

Next, explanation will be given on the one-chip microcomputer 1.

According to the contents of the program stored in the ROM 4, when the CPU 3 sets the data for selecting the digital signal input/output port 10 in the digital/analog converter select register 7, the digital signal input/output port 10 becomes in the enable state and the digital/analog converting circuit 12 becomes in the non output state respectively. Accordingly, the function of the signal input/output terminal 2 becomes the one for inputting/outputting a digital signal through the digital signal input/output port 10.

When data is set in the data register 6 from the CPU 3, and further, data selecting the digital/analog converting circuit 12 is set in the digital/analog converter select register 7, the digital signal input/output port 10 becomes in the non-output state, that, is, the state where neither pull-up nor port output is performed, and the digital/analog converting circuit 12 becomes in the output state. Accordingly, the function of the signal input/output terminal 2 becomes the one for outputting an analog signal from the digital/analog converting circuit 12.

When the digital/analog converting circuit 12 is in the non-output state, the MOS transistor 20 or the non-inverting buffer $B_{n+1}$ in the digital/analog converting circuit 12 becomes in the non-output state, as aforementioned. Therefore, current does not flow through the MOS transistor 20 or the non-inverting buffer $B_{n+1}$. Accordingly, even when a digital signal is inputted from the outside to the signal input/output terminal 2 while an analog signal is not outputted, there is no possibility that the voltage level of the digital signal is not changed.

In this embodiment, the terminal of the digital/analog converting circuit is also used for the digital signal input/output port, however, the terminal of the digital/analog converting circuit may also be used for the digital signal input port or the digital signal output port.

Also in this embodiment, the digital/analog converting circuit is built in a one-chip microcomputer, however, this is only an example, and it is a matter of course that the same effect can be obtained by applying the digital/analog converting circuit to other than the one-chip microcomputer. Further, a digital signal is inputted to a non-inverting buffer, however, it is possible to use an inverting buffer in place of a non-inverting buffer.

As aforementioned, since the digital/analog converting circuit is not so configured that the output/non-output of an analog signal obtained by converting a digital signal is switched by the switching circuit using a transistor, the linearity of the digital/analog conversion characteristic is not to be damaged by the on-resistance of the transistor. Therefore, a digital signal can be converted into an analog signal in high accuracy all over the region in which a digital signal changes.

When an analog signal after converting a digital signal is not outputted, since the resistance for converting a digital signal into an analog signal is separated from the positive or negative reference potential, current does not flow through the resistance uselessly. Therefore, even when a digital signal is inputted from the outside to the signal input/output terminal, there is no possibility that the voltage level is changed.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalents of such meets and bounds thereof are therefore intended to be embraced by the claims.

What is claimed is:

1. A digital/analog converting circuit, comprising:

n number first switching elements each having an output resistance value r and an end to which a signal of each bit of a digital signal of n bits is inputted, each first switching element, in response to a control signal, outputting a positive or negative reference potential corresponding to the input signal from another end, or being in a state of not outputting;

n number first resistances each having a resistance value 2R–r and one end to which the output of said first switching element is inputted;

n–1 number second resistances each having a resistance value R, and each connecting other ends of said n number first resistances in the form of a ladder and in the bit order of said digital signal;

a second switching element having an on-resistance value r and one end connected to a signal outputting means for outputting a reference potential, said second switching element, in response to the control signal, outputting the reference potential from another end or being in the state of not outputting; and a resistance having a resistance value 2R–r, and connecting the other end of said second switching element and the other end of the first resistance corresponding to the lowest bit of said digital signal;

whereby, in response to said control signal, the other end of said first resistance outputs said digital signal converted into an analog signal.

2. The digital/analog converting circuit as set forth in claim 1, wherein each of said n number first switching elements is composed of a three-state buffer, and said second switching element is composed of a MOS transistor with said one end connected to ground potential.

3. The digital/analog converting circuit as set forth in claim 1, wherein each of said n number first switching elements and the second switching element is composed of a three-state buffer, and said signal outputting means generates negative reference potential and outputs it to said second switching element.

4. The digital/analog converting circuit as set forth in claim 1, wherein each of said n number first switching elements and the second switching element is composed of a three-state buffer, and said signal outputting means generates a positive reference potential and outputs it to said second switching element.

* * * * *